(12) United States Patent
Choi et al.

(10) Patent No.: US 9,190,297 B2
(45) Date of Patent: Nov. 17, 2015

(54) SEMICONDUCTOR DEVICE AND METHOD OF FORMING A STACKABLE SEMICONDUCTOR PACKAGE WITH VERTICALLY-ORIENTED DISCRETE ELECTRICAL DEVICES AS INTERCONNECT STRUCTURES

(75) Inventors: DaeSik Choi, Seoul (KR); YeongIm Park, Kyounggi-do (KR); HyungMin Lee, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 480 days.

(21) Appl. No.: 13/208,027

(22) Filed: Aug. 11, 2011

(65) Prior Publication Data

US 2013/0037936 A1 Feb. 14, 2013

(51) Int. Cl.
*H01L 21/50* (2006.01)
*H01L 23/498* (2006.01)
(Continued)

(52) U.S. Cl.
CPC ............ *H01L 21/565* (2013.01); *H01L 21/561* (2013.01); *H01L 23/49816* (2013.01); *H01L 23/49822* (2013.01); *H01L 23/49833* (2013.01); *H01L 23/5389* (2013.01); *H01L 25/16* (2013.01); *H01L 23/3128* (2013.01); *H01L 24/16* (2013.01); *H01L 24/32* (2013.01); *H01L 24/48* (2013.01); *H01L 24/73* (2013.01); *H01L 25/105* (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/32225* (2013.01); *H01L 2224/48091* (2013.01); *H01L 2224/48227* (2013.01);
(Continued)

(58) Field of Classification Search
CPC ........ H01L 21/50; H01L 23/498; H01L 21/56
USPC ........... 257/737, E21.502, E21.499, E23.068; 438/126, 107
See application file for complete search history.

(56) References Cited

U.S. PATENT DOCUMENTS 6,418,029 B1 7/2002 McKee et al.
6,838,313 B2 1/2005 Kumamoto et al.
(Continued)

*Primary Examiner* — Walter H Swanson
(74) *Attorney, Agent, or Firm* — Robert D. Atkins; Atkins and Associates, P.C.

(57) ABSTRACT

A semiconductor device has a substrate and first semiconductor die to the substrate. A plurality of vertically-oriented discrete electrical devices, such as a capacitor, inductor, resistor, diode, or transistor, is mounted over the substrate in proximity to the first semiconductor die. A first terminal of the discrete electrical devices is connected to the substrate. A plurality of bumps is formed over the substrate adjacent to the discrete electrical devices. An encapsulant is deposited over and between the first semiconductor die and substrate. A portion of the bumps and a second terminal of the discrete electrical devices is exposed from the encapsulant. An interconnect structure is formed over a surface of the substrate opposite the first semiconductor die. The semiconductor devices are stackable and electrically connected through the substrate, discrete electrical devices, and bumps. A heat spreader or second semiconductor die can be disposed between the stacked semiconductor devices.

36 Claims, 14 Drawing Sheets

(51) Int. Cl.
*H01L 21/56* (2006.01)
*H01L 23/538* (2006.01)
*H01L 25/16* (2006.01)
*H01L 23/31* (2006.01)
*H01L 25/10* (2006.01)
*H01L 23/00* (2006.01)

(52) U.S. Cl.
CPC ............... *H01L2224/73253* (2013.01); *H01L 2224/73265* (2013.01); *H01L 2224/92125* (2013.01); *H01L 2224/97* (2013.01); *H01L 2225/1023* (2013.01); *H01L 2225/1041* (2013.01); *H01L 2225/1058* (2013.01); *H01L 2225/1094* (2013.01); *H01L 2924/01322* (2013.01); *H01L 2924/12041* (2013.01); *H01L 2924/13091* (2013.01); *H01L 2924/15311* (2013.01); *H01L 2924/15331* (2013.01); *H01L 2924/18161* (2013.01)

(56) References Cited

U.S. PATENT DOCUMENTS

| | | |
|---|---|---|
| 2006/0245308 A1 | 11/2006 | Macropoulos et al. |
| 2007/0278660 A1* | 12/2007 | Han et al. ............... 257/698 |
| 2010/0230806 A1* | 9/2010 | Huang et al. ........... 257/723 |
| 2010/0237477 A1* | 9/2010 | Pagaila et al. .......... 257/660 |
| 2010/0289126 A1* | 11/2010 | Pagaila et al. .......... 257/659 |
| 2011/0057308 A1 | 3/2011 | Choi et al. |
| 2011/0316119 A1* | 12/2011 | Kim et al. ............... 257/532 |
| 2012/0168963 A1* | 7/2012 | Huang et al. ........... 257/774 |

* cited by examiner

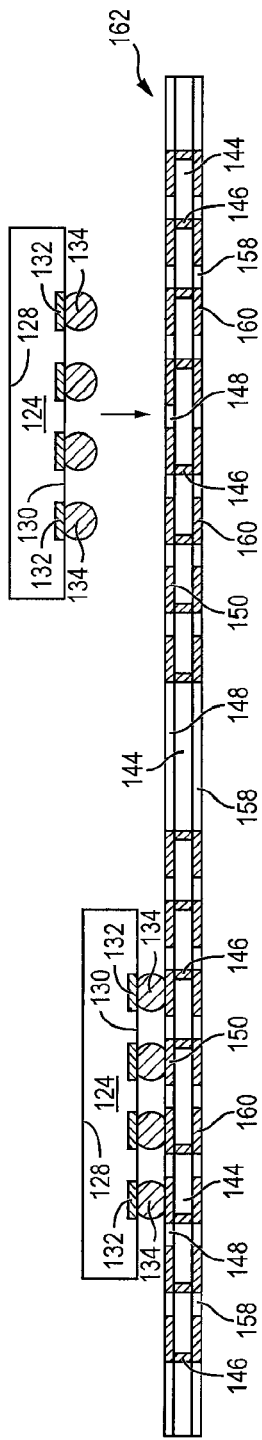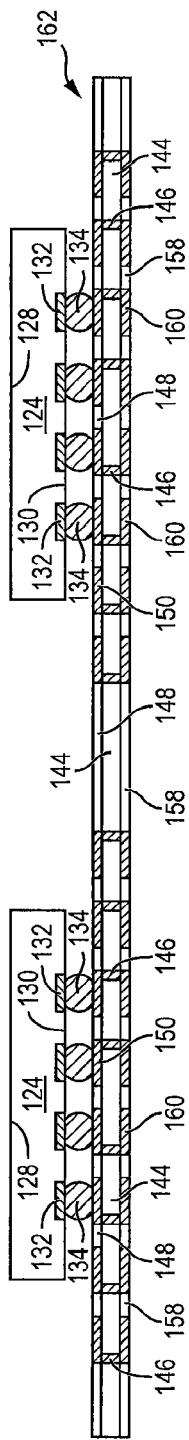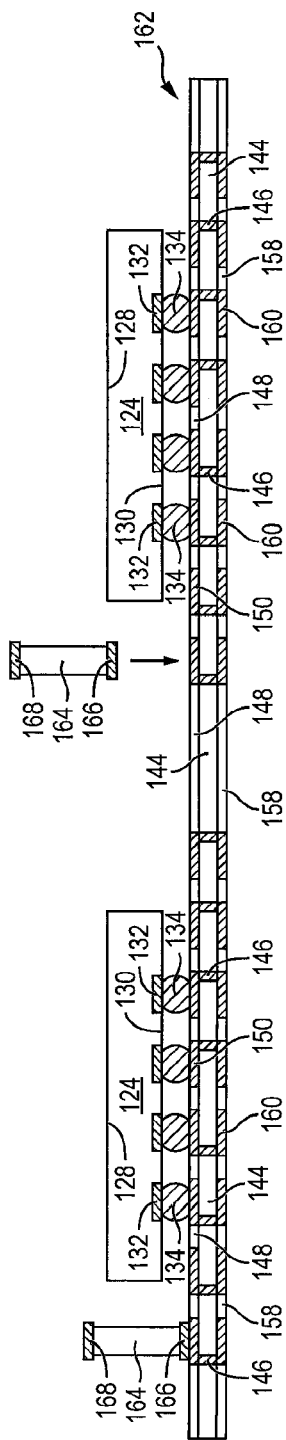

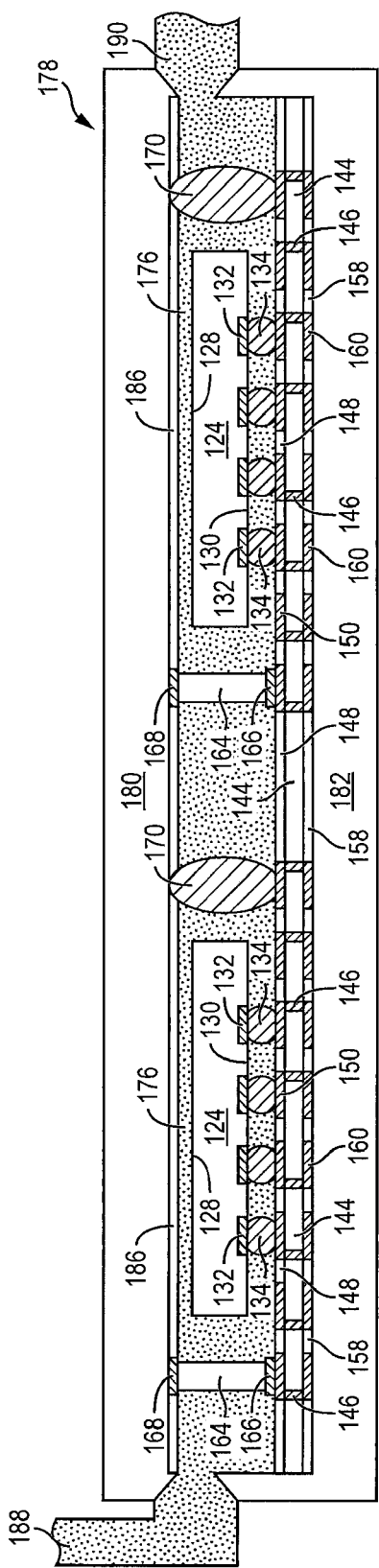
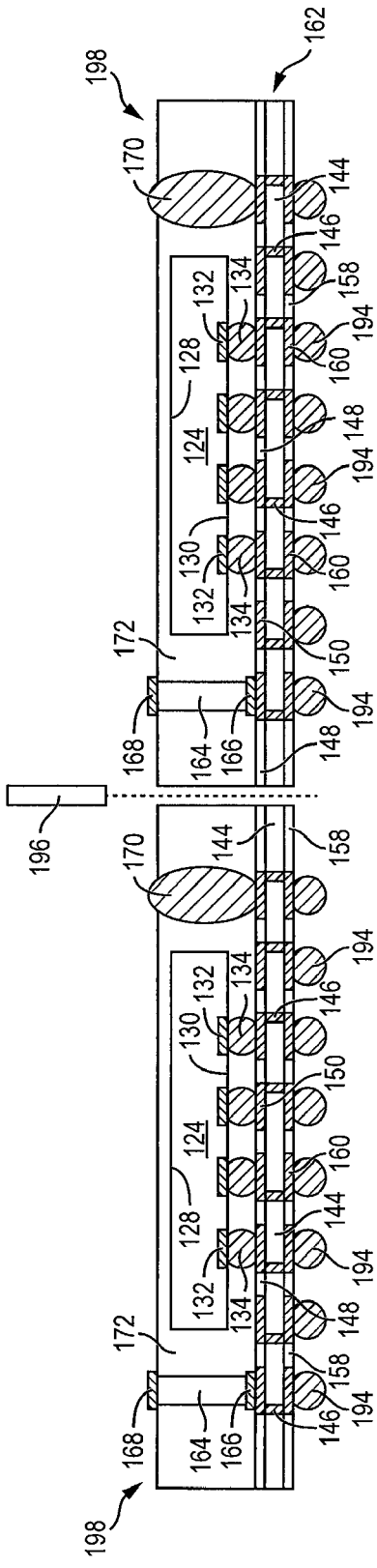
FIG. 5k
FIG. 5l

US 9,190,297 B2

SEMICONDUCTOR DEVICE AND METHOD OF FORMING A STACKABLE SEMICONDUCTOR PACKAGE WITH VERTICALLY-ORIENTED DISCRETE ELECTRICAL DEVICES AS INTERCONNECT STRUCTURES

FIELD OF THE INVENTION

The present invention relates in general to semiconductor devices and, more particularly, to a semiconductor device and method of forming a stackable semiconductor package with vertically-oriented discrete electrical devices and bumps as interconnect structures.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional semiconductor package 10 with a semiconductor die 12 having an active surface 14. Bumps 16 are formed on contact pads 18 on active surface 14. Semiconductor die 12 is mounted to substrate 20 with bumps 16. Discrete passive devices 22 are mounted to substrate 20 around semiconductor die 12. In particular, discrete passive devices 22 are mounted laterally to substrate 20 with terminals 24 and 26 electrically connected to the substrate. Discrete passive devices 22 have a greater length across substrate 20 than height above the substrate. An encapsulant 30 is deposited over semiconductor die 12 and discrete passive devices 22. The laterally-oriented discrete passive devices 22 consume a significant area of substrate 20 and limit the placement density of the discrete passive devices.

SUMMARY OF THE INVENTION

A need exists for a simple and cost effective electrical interconnect for stackable semiconductor packages. Accordingly, in one embodiment, the present invention is a method of making a semiconductor device comprising the steps of providing a first substrate, mounting a first semiconductor die to the first substrate, mounting a plurality of vertically-oriented discrete electrical devices over the first substrate with a first terminal of the vertically-oriented discrete electrical devices connected to the first substrate, forming a plurality of bumps over the first substrate adjacent to the vertically-oriented discrete electrical devices, depositing an encapsulant over and between the first semiconductor die and first substrate so that a portion of the bumps and a second terminal of the vertically-oriented discrete electrical devices opposite the first terminal is exposed from the encapsulant, and forming an interconnect structure over a surface of the first substrate opposite the first semiconductor die.

In another embodiment, the present invention is a method of making a semiconductor device comprising the steps of providing a first substrate, mounting a semiconductor die to the first substrate, mounting a discrete electrical device to the first substrate with a first terminal of the discrete electrical device connected to the first substrate, depositing an encapsulant over and between the semiconductor die and first substrate so that a second terminal of the discrete electrical device opposite the first terminal is exposed from the encapsulant, and forming a first interconnect structure over a surface of the first substrate opposite the semiconductor die.

In another embodiment, the present invention is a method of making a semiconductor device comprising the steps of providing a first substrate, mounting a semiconductor die to the first substrate, mounting a first terminal of a discrete electrical device over the first substrate, and depositing an encapsulant over the semiconductor die and first substrate so that a second terminal of the discrete electrical device opposite the first terminal is exposed from the encapsulant.

In another embodiment, the present invention is a semiconductor device comprising a substrate and semiconductor die mounted to the substrate. A discrete electrical device is mounted over the substrate with a first terminal of the discrete electrical device connected to the substrate. A first interconnect structure is formed over the substrate adjacent to the discrete electrical device. An encapsulant is deposited over the semiconductor die and substrate so that a second terminal of the discrete electrical device is exposed from the encapsulant. A second interconnect structure is formed over a surface of the substrate opposite the semiconductor die.

BRIEF DESCRIPTION OF THE DRAWINGS

FIGS. 5a-5l illustrate a process of forming a stackable semiconductor package with vertically-oriented discrete electrical devices as interconnect structures;

DETAILED DESCRIPTION OF THE DRAWINGS

Figure 1:
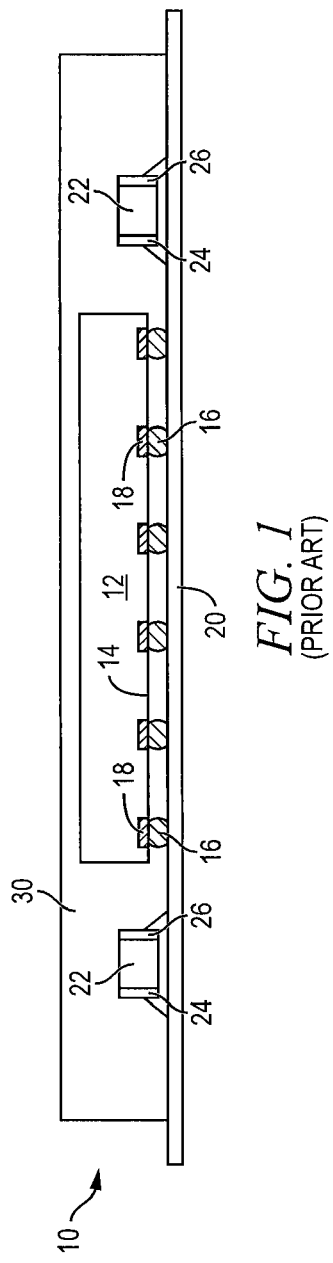
FIG. 1 illustrates a conventional semiconductor package with discrete passive devices mounted laterally to a substrate around a semiconductor die.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
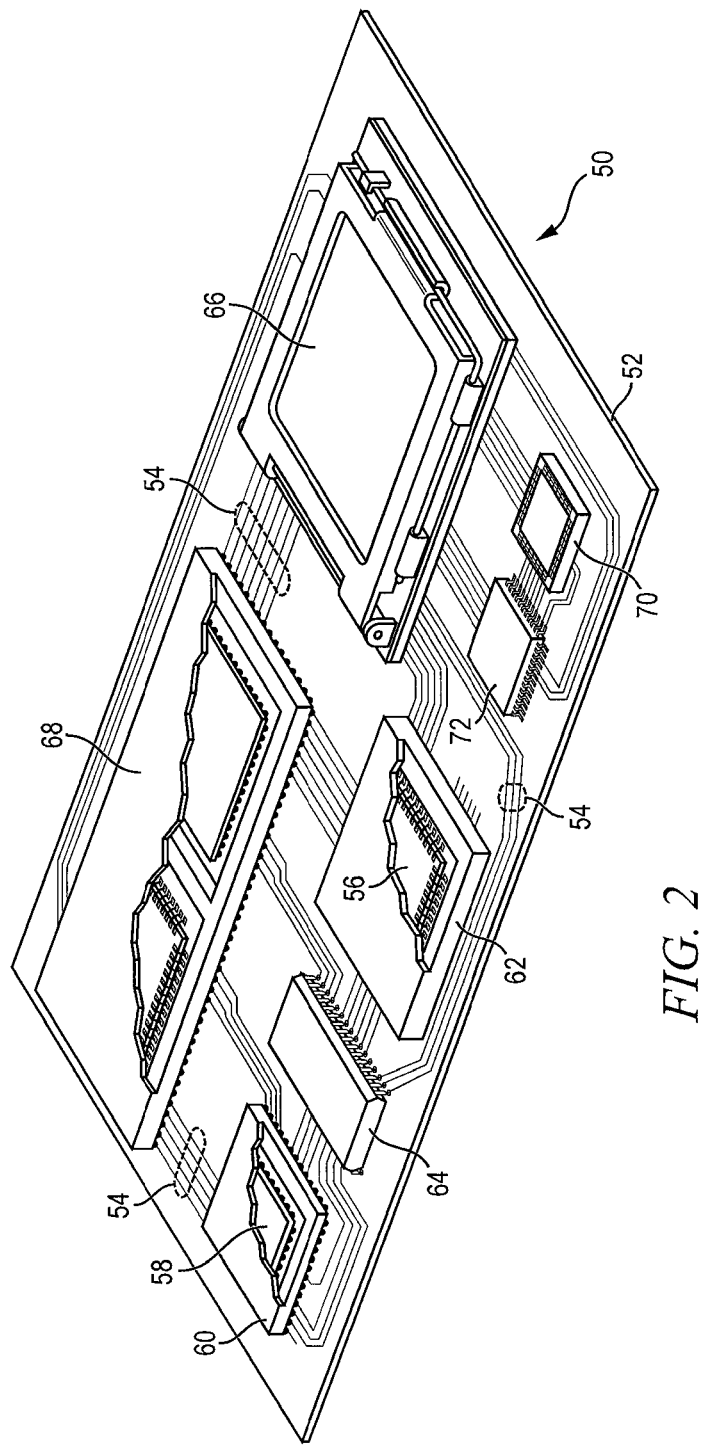
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
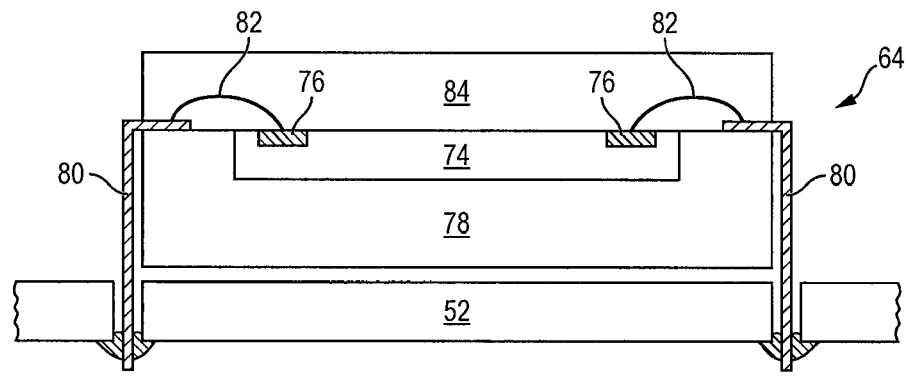
FIGS. 3a-3c illustrate further detail of the representative semiconductor packages mounted to the PCB.
Figure 3B:
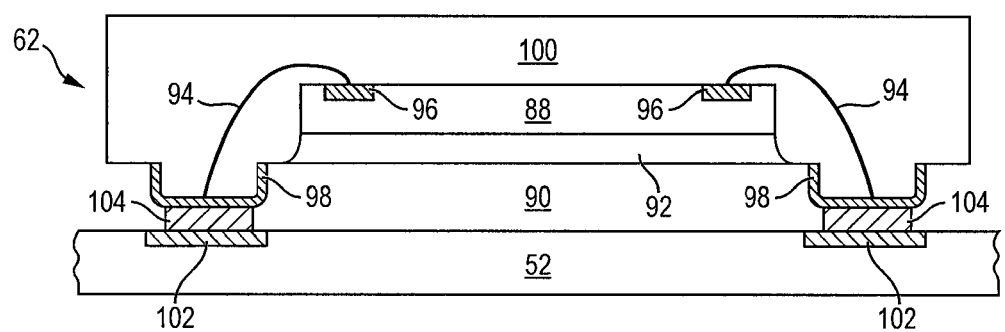
Figure 3C:
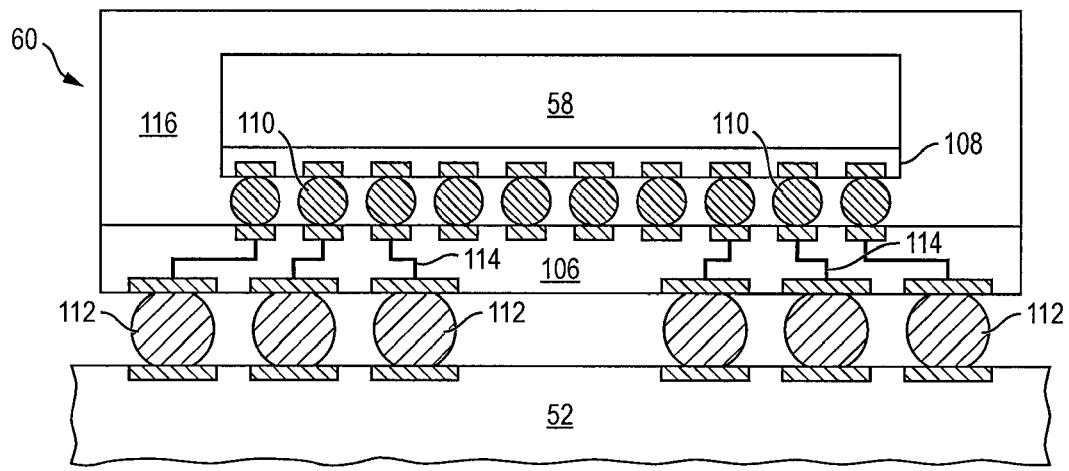

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
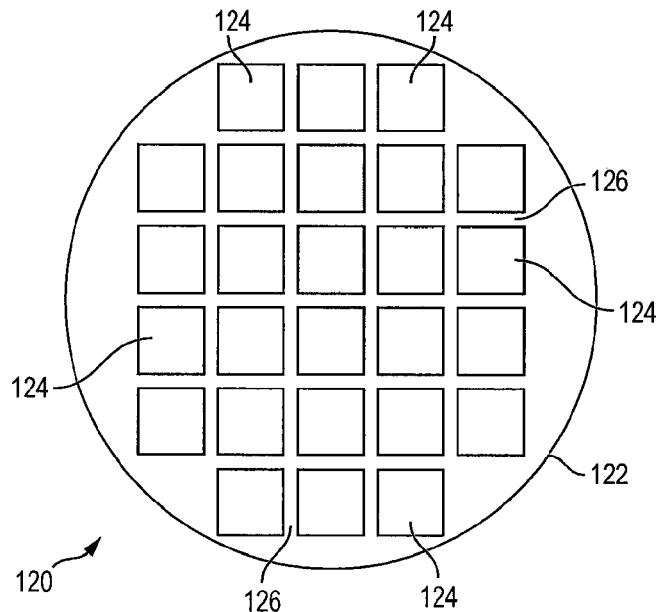
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 4B:
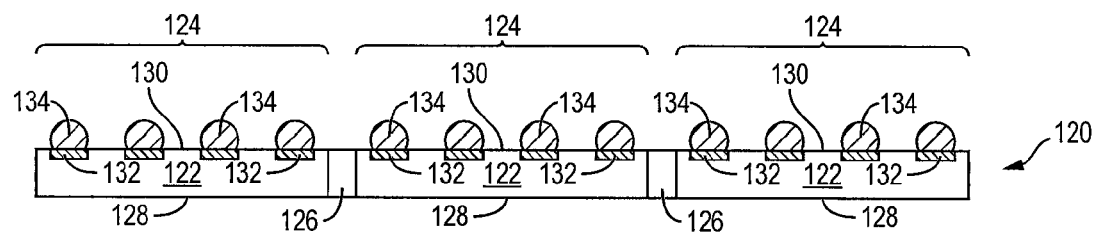

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Semiconductor die 124 can be a flipchip type die, conductive through silicon vias (TSV) die, or bond wire die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132. Bumps 134 can also be compression bonded to conductive layer 132. Bumps 134 represent one type of interconnect structure that can be formed over conductive layer 132. The interconnect structure can also use stud bump, micro bump, or other electrical interconnect.

Figure 4C:
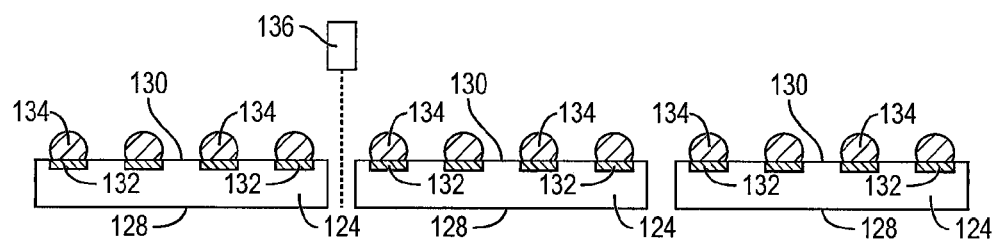

In FIG. 4c, semiconductor wafer 120 is singulated through saw street 126 using a saw blade or laser cutting tool 136 into individual semiconductor die 124.

Figure 5A:
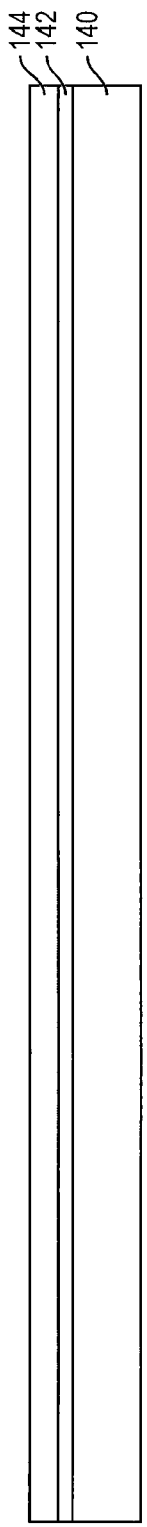

FIGS. 5a-5l illustrate, in relation to FIGS. 2 and 3a-3c, a process of forming a stackable semiconductor package with vertically-oriented discrete electrical devices and bumps as interconnect structures. In FIG. 5a, a temporary substrate or carrier 140 contains sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

Figure 5B:
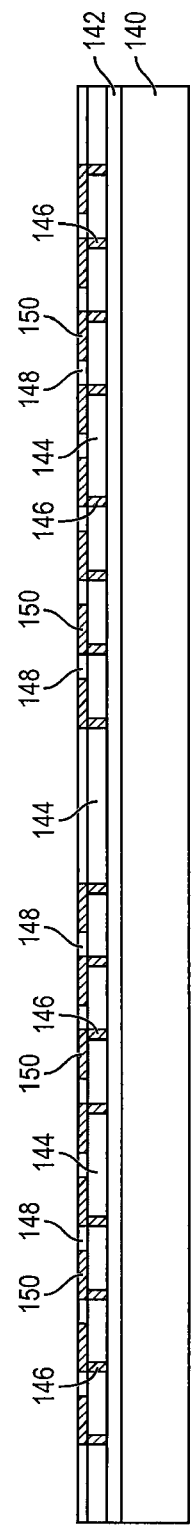

In FIG. 5b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive through silicon vias (TSV) 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

Figure 5C:
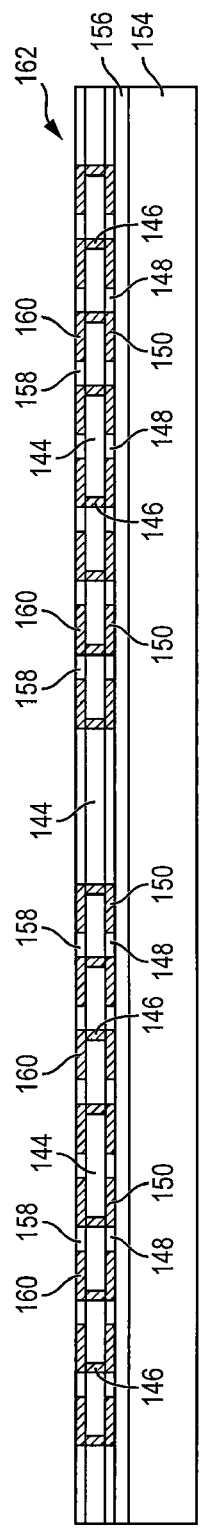

In FIG. 5c, a temporary substrate or carrier 154 contains sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160. Conductive layers 150 and 160 can be formed prior to insulating layer 148 and 158, respectively. The resulting wafer-form substrate 162 provides electrical interconnect vertically and laterally across the substrate.

In FIG. 5d, semiconductor die 124 from FIGS. 4a-4c are mounted to conductive layer 150 of substrate 162 using a pick and place operation with active surface 130 oriented toward the carrier. Bumps 134 are reflowed to electrically connect conductive layer 132 of semiconductor die 124 to conductive layer 150 of substrate 162. FIG. 5e shows semiconductor die 124 mounted to substrate 162.

In FIG. 5f, a vertically-oriented discrete passive or active electrical device 164 is positioned over and mounted to conductive layer 150 of substrate 162 around or in proximity to semiconductor die 124 using a pick and place operation. The electrical device 164 can be a capacitor, resistor, inductor, diode, transistor, or other discrete device having electrical connection terminals 166 and 168. Terminal 166 is disposed on one end of discrete electrical device 164. Terminal 168 is disposed on a distal end of discrete electrical device 164 opposite terminal 166. Other discrete electrical devices 164 can have three or more electrical connection terminals. Terminal 166 is electrically connected to conductive layer 150. Discrete electrical device 164 has a height above substrate 162, i.e., length between terminals 166 and 168, greater than a width of terminal 166 or terminal 168. In one embodiment, discrete electrical devices 164 extend above back surface 128 of semiconductor die 124.

Figure 5G:
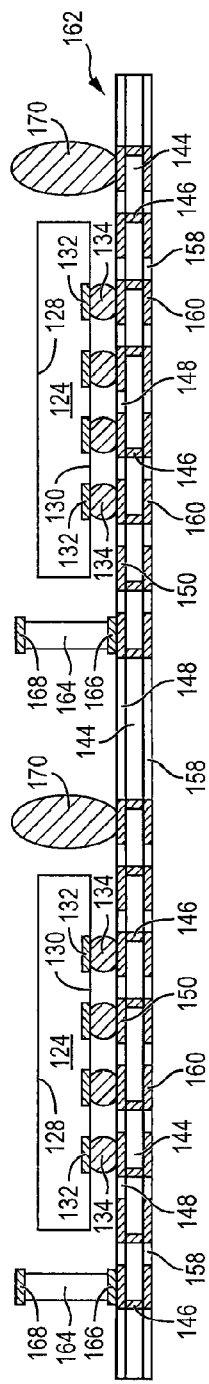

FIG. 5g shows discrete electrical devices 164 disposed over conductive layer 150 of substrate 162 adjacent to or in proximity to semiconductor die 124. An electrically conductive bump material is deposited over conductive layer 150 of substrate 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 170. In some applications, bumps 170 are reflowed a second time to improve electrical contact to conductive layer 150. Bumps 170 have sufficient height to extend above back surface 128 of semiconductor die 124. An under bump metallization (UBM) layer can be formed under bumps 170. Bumps 170 can also be compression bonded to conductive layer 150. Bumps 170 represent one type of interconnect structure that can be formed over conductive layer 150. The interconnect structure can also use stud bump, conductive pillar, or other electrical interconnect.

Figure 5H:
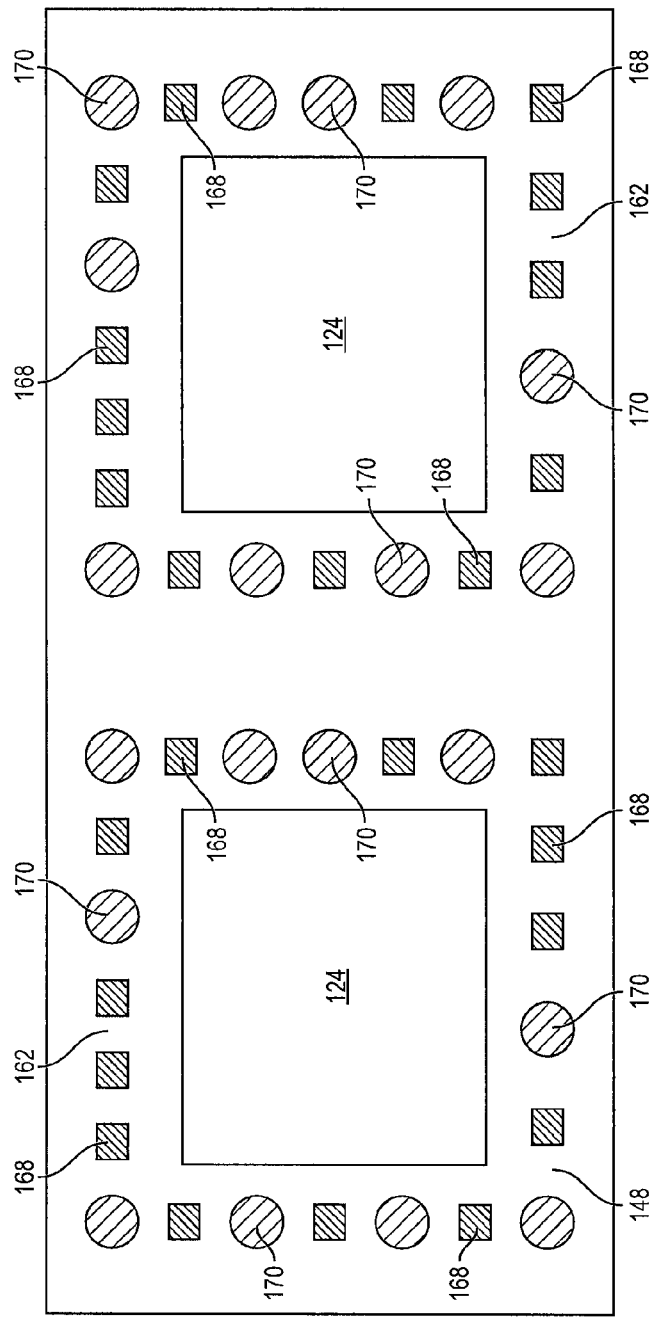

FIG. 5h shows a plan view of discrete electrical devices 164 and bumps 170 disposed over substrate 162 around a perimeter of semiconductor die 124. The vertical orientation of discrete electrical device 164 has a narrow cross-section, as seen in FIGS. 5g and 5h, to maximize the placement density of the discrete electrical devices. That is, the vertically-oriented discrete electrical device 164 has a small footprint and consumes a minimal area on substrate 162. The number and location of discrete electrical devices 164 and bumps 170 can be selected according to the electrical function of semiconductor die 124. Some discrete electrical devices 164 are placed side-by-side. Some bumps 170 are placed side-by-side. Other discrete electrical devices 164 are placed adjacent to bumps 170.

Figure 5I:
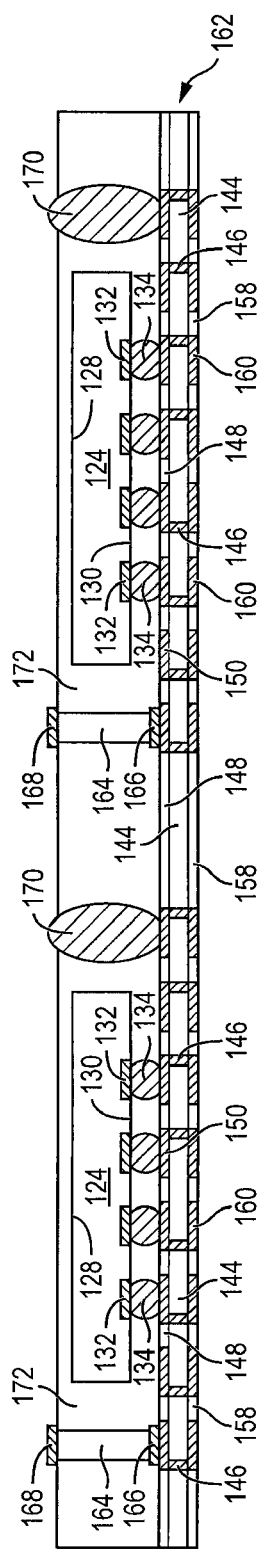

In FIG. 5i, an encapsulant or molding compound 172 is deposited over and between semiconductor die 124 and substrate 162 and around discrete electrical devices 164 and bumps 170 using a paste printing, compressive molding, transfer molding, liquid encapsulant molding, vacuum lamination, spin coating, or other suitable applicator. Encapsulant 172 can be polymer composite material, such as epoxy resin with filler, epoxy acrylate with filler, or polymer with proper filler. The viscosity of encapsulant 172 is selected for uniform coverage, e.g., a lower viscosity increases the flow of the encapsulant. Encapsulant 172 is non-conductive and environmentally protects the semiconductor device from external elements and contaminants.

The amount of encapsulant 172 is controlled so that bumps 170 and terminal 168 of discrete electrical devices 164 extend above or are exposed from the encapsulant. Alternatively, a portion of encapsulant 172 is removed by an etching process to expose bumps 170 and terminal 168 of discrete electrical devices 164.

Figure 5J:
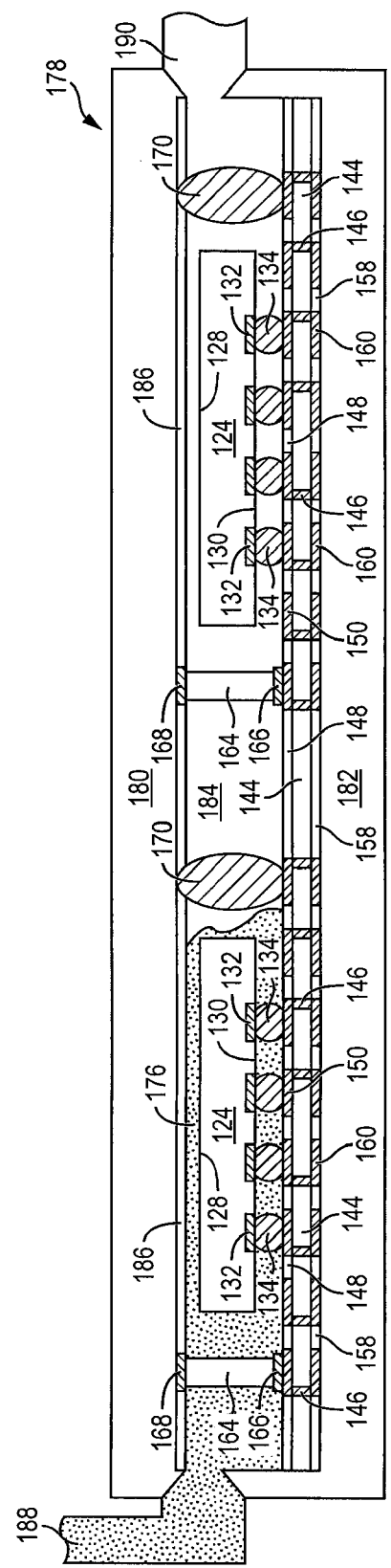

In another embodiment, a mold underfill (MUF) material 176 is deposited over and between semiconductor die 124 and substrate 162 with a MUF process, as shown in FIG. 5j. Chase mold 178 has an upper mold support 180 and lower mold support 182 are brought together to enclose semiconductor die 124 and substrate 162 with open space 184. The upper mold support 180 includes compressible releasing film 186 to prevent formation of MUF material 176 over terminals 168 and top of bumps 170. MUF material 176 in a liquid state is injected into one side of chase mold 178 with nozzle 188 while an optional vacuum assist 190 draws pressure from the opposite side to uniformly fill open space 184 around semiconductor die 124 and substrate 162 with the MUF material. MUF material 176 can be polymer composite material, such as epoxy resin with filler, epoxy acrylate with filler, or polymer with proper filler. FIG. 5k shows MUF material 176 disposed around and between semiconductor die 124 and substrate 162.

In another embodiment, encapsulant 172 or MUF material 176 is deposited coplanar with back surface 128 of semiconductor die 124 so that the back surface is exposed from the encapsulant.

In FIG. 5l, an electrically conductive bump material is deposited over conductive layer 160 of substrate 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 194. In some applications, bumps 194 are reflowed a second time to improve electrical contact to conductive layer 160. A UBM layer can be formed under bumps 194. Bumps 194 can also be compression bonded to conductive layer 160. Bumps 194 represent one type of interconnect structure that can be formed over conductive layer 160. The interconnect structure can also use stud bump, micro bump, or other electrical interconnect.

Figure 6A:
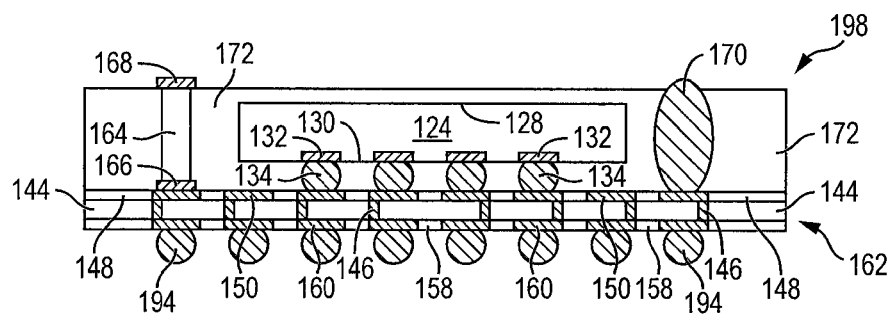
FIGS. 6a-6b illustrate the stackable semiconductor package with vertically-oriented discrete electrical devices and bumps as interconnect structures.

Semiconductor die 124 are singulated through encapsulant 172 and substrate 162 with saw blade or laser cutting tool 196 into individual stackable semiconductor packages 198. FIG. 6a shows stackable semiconductor package 198 after singulation. Semiconductor die 124 is electrically connected through bumps 134 to conductive layers 150 and 160, conductive vias 146, and bumps 194 of substrate 162. Semiconductor die 124 is also electrically connected through substrate 162 to discrete electrical device 164 and bumps 170.

Figure 6B:
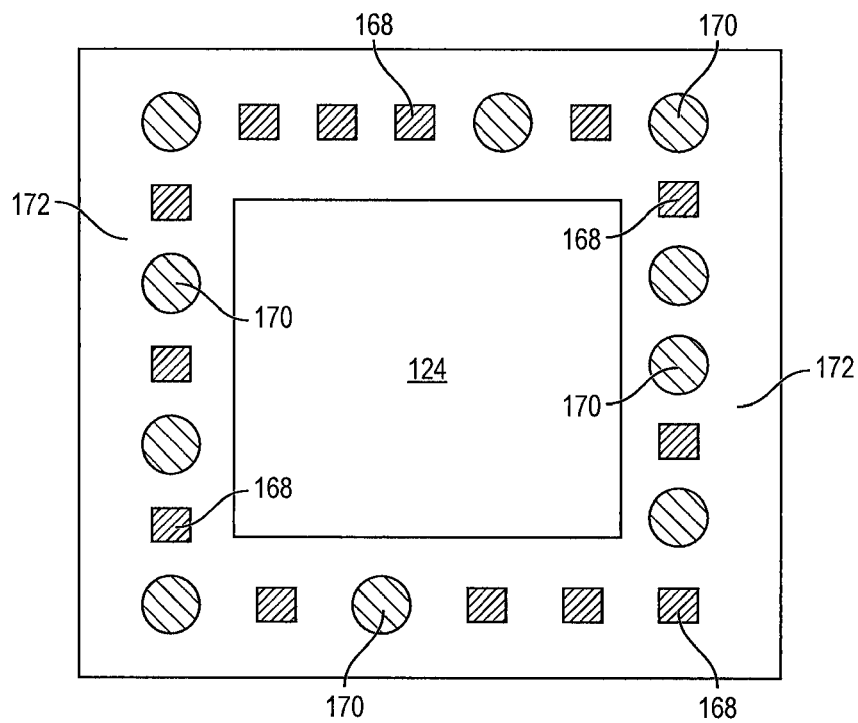

FIG. 6b shows a plan view of discrete electrical devices 164 and bumps 170 disposed around a perimeter of semiconductor die 124. The vertically-oriented discrete electrical devices 164 provide z-direction electrical interconnect while operating with the electrical function of semiconductor die 124. For example, discrete electrical devices 164 provide a capacitive function for semiconductor die 124. The vertical orientation of discrete electrical device 164 has a narrow cross-section and small footprint to maximize the placement density and consume a minimal area on substrate 162. The vertically-oriented discrete electrical devices 164 maintain interconnect coplanarity while reducing contact area. The vertically-oriented discrete electrical devices 164 and bumps 170 are embedded with encapsulant 172 or MUF material 176 for stability and strength. Terminals 168 provide sufficient contact surface area to exhibit good joint strength for z-direction electrical interconnect. Stackable semiconductor package 198 provide a simple and cost effective structure for vertical interconnect of semiconductor die 124 combining the electrical function of vertically-oriented discrete electrical devices 164 with z-direction vertical interconnect.

Figure 7:
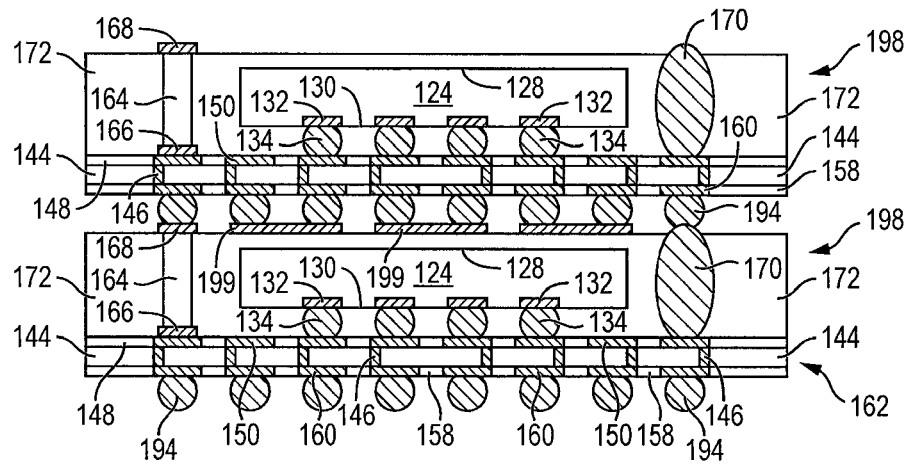
FIG. 7 illustrates two stacked semiconductor packages with vertically-oriented discrete electrical devices and bumps as interconnect structures.

FIG. 7 shows two stacked semiconductor packages 198. Semiconductor die 124 in the lower semiconductor package 198 is electrically connected to semiconductor die 124 in the upper semiconductor package 198 through bumps 134 and 170, substrates 162, and discrete electrical devices 164. A conductive layer or RDL 199 can be formed over encapsulant 172 of the lower semiconductor package 198 for electrical interconnect to bumps 194 of the upper semiconductor package 198.

Figure 8A:
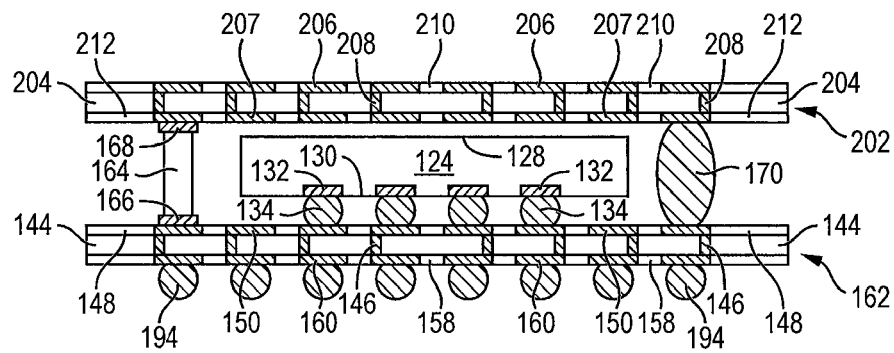
FIGS. 8a-8c illustrate the stackable semiconductor package with upper and lower substrates mounted to the discrete electrical devices prior to encapsulation.
Figure 8B:
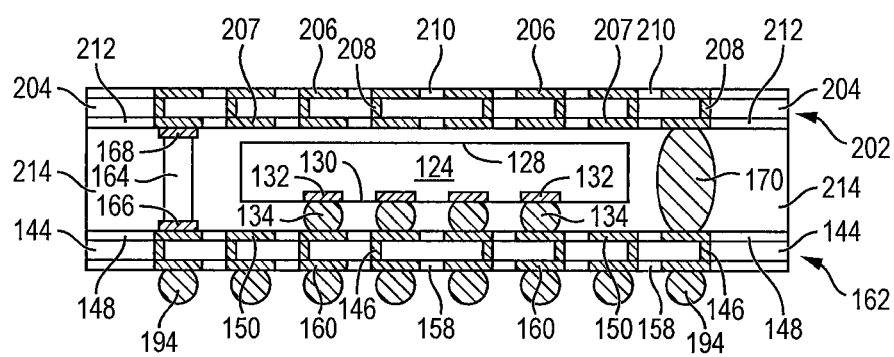
Figure 8C:
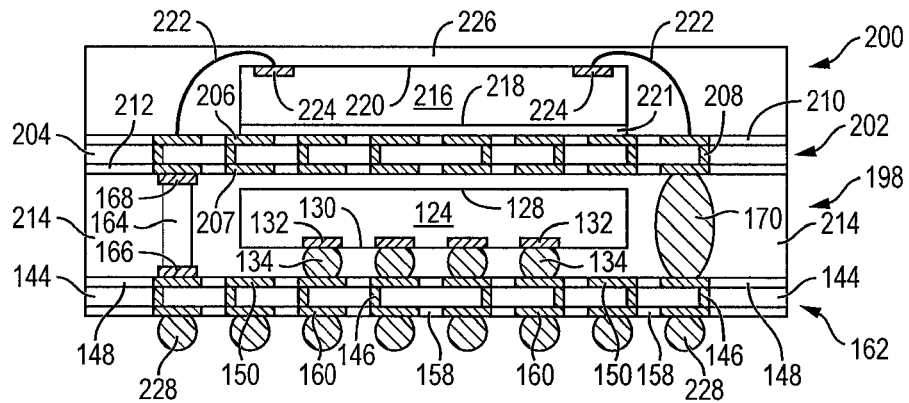

FIGS. 8a-8c show an embodiment of stackable semiconductor die 200, similar to FIGS. 6a-6b, with substrate 202 mounted to terminals 168 of discrete electrical devices 164 and bumps 170 prior to encapsulation. Substrate 202 is formed similar to FIGS. 5a-5c with substrate 204, conductive layers 206 and 207, conductive vias 208, and insulating layers 210 and 212. Continuing from FIG. 5h, substrate 202 is mounted to terminals 168 and bumps 170, as shown in FIG. 8a. In FIG. 8b, encapsulant 214 is deposited over and between semiconductor die 124 and substrates 162 and 202, discrete electrical devices 164, and bumps 170, similar to FIGS. 5i-5k. Substrates 162 and 202 provide structural support by the metallurgical connection to discrete electrical devices 164 and bumps 170 during encapsulation.

In FIG. 8c, semiconductor die 216 originates from a semiconductor wafer, similar to FIGS. 4a-4c. Semiconductor die 216 has a back surface 218 and active surface 220 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 220 to implement analog circuits or digital circuits, such as DSP, ASIC, memory, or other signal processing circuit. Semiconductor die 216 may also contain IPDs, such as inductors, capacitors, and resistors, for RF signal processing.

Semiconductor die 216 is mounted back surface 218 to substrate 202 with adhesive layer 221. Bond wires 222 are formed between contact pads 224 on semiconductor die 216 and conductive layer 206 of substrate 202. An encapsulant or molding compound 226 is deposited over semiconductor die 216 and substrate 202 using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants. Bumps 228 are formed over conductive layer 160 of substrate 162.

Figure 9:
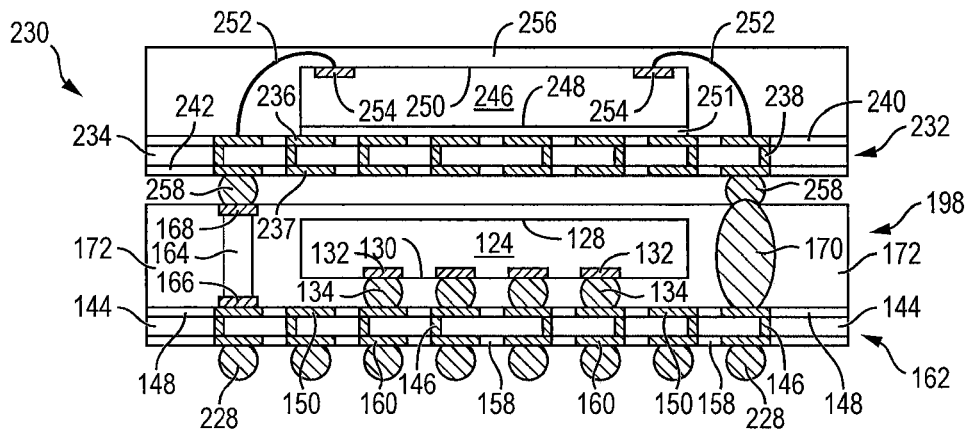
FIG. 9 illustrates two stacked semiconductor packages interconnected with discrete electrical devices.

FIG. 9 shows an embodiment of stackable semiconductor package 230, similar to FIG. 6a. Substrate 232 is formed similar to FIGS. 5a-5c with substrate 234, conductive layers 236 and 237, conductive vias 238, and insulating layers 240 and 242. Semiconductor die 246 originates from a semiconductor wafer, similar to FIGS. 4a-4c. Semiconductor die 246 has a back surface 248 and active surface 250 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 250 to implement analog circuits or digital circuits, such as DSP, ASIC, memory, or other signal processing circuit. Semiconductor die 246 may also contain IPDs, such as inductors, capacitors, and resistors, for RF signal processing.

Semiconductor die 246 is mounted back surface 248 to substrate 232 with adhesive layer 251. Bond wires 252 are formed between contact pads 254 on semiconductor die 246 and conductive layer 236 of substrate 232. An encapsulant or molding compound 256 is deposited over and between semiconductor die 246 and substrate 232 using a paste printing, compressive molding, transfer molding, liquid encapsulant molding, vacuum lamination, spin coating, or other suitable applicator. Encapsulant 256 can be polymer composite material, such as epoxy resin with filler, epoxy acrylate with filler, or polymer with proper filler. Encapsulant 256 is non-conductive and environmentally protects the semiconductor device from external elements and contaminants. Bumps 258 are formed over conductive layer 237 of substrate 232. Substrate 232 and semiconductor die 246 are mounted to terminal 168 of discrete electrical devices 164 and bumps 170 of semiconductor package 198. Bumps 258 are reflowed to electrically connect conductive layer 237 of substrate 232 to terminals 168 and bumps 170.

Figure 10:
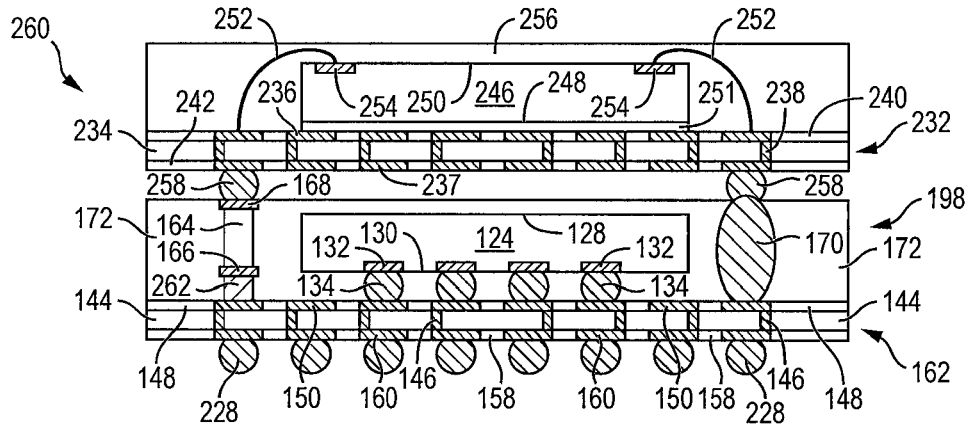
FIG. 10 illustrates the two stacked semiconductor packages interconnected with discrete electrical devices having vertical standoff with conductive pillars.

FIG. 10 shows an embodiment of stackable semiconductor package 260, similar to FIG. 9, with discrete electrical device 164 mounted in line with conductive pillar 262 for additional vertical extension or standoff for the discrete electrical devices.

Figure 11:
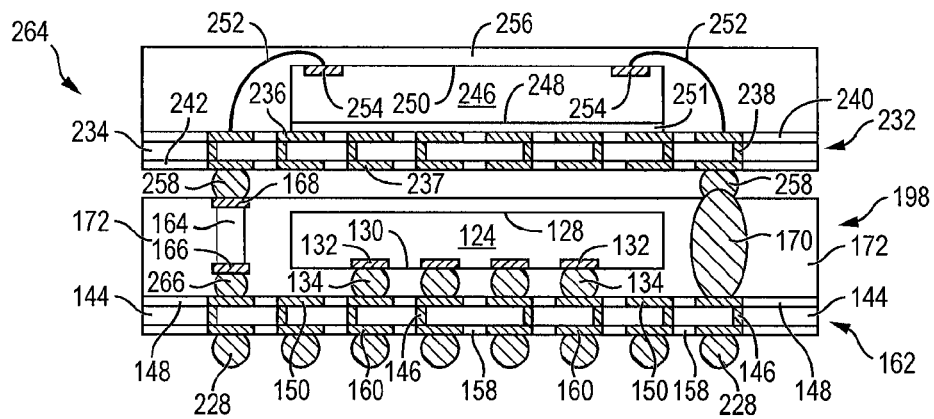
FIG. 11 illustrates the two stacked semiconductor packages interconnected with discrete electrical devices having vertical standoff with bumps.

FIG. 11 shows an embodiment of stackable semiconductor package 264, similar to FIG. 9, with discrete electrical device 164 mounted in line with bumps 266 for additional vertical extension or standoff for the discrete electrical devices.

Figure 12:
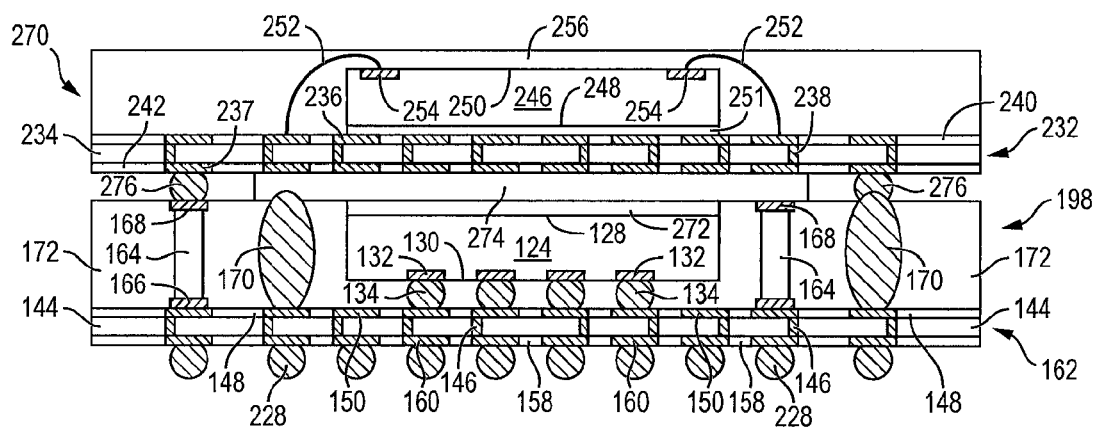
FIG. 12 illustrates the two stacked semiconductor packages with vertically-oriented discrete electrical devices as interconnect structures and intermediate heat spreader and TIM.

FIG. 12 shows an embodiment of stackable semiconductor package 270, similar to FIG. 9, with a thermal interface material (TIM) 272 deposited over back surface 128 of semiconductor die 124. TIM 272 is a thermal epoxy, thermal epoxy resin, or thermal conductive paste. Heat spreader or heat sink 274 is positioned over and mounted to TIM 272 over semiconductor die 124. Heat spreader 274 can be Cu, Al, or other material with high thermal conductivity. Heat spreader 274 and TIM 272 form a thermally conductive path that distributes and dissipates the heat generated by the high frequency electronic components of semiconductor die 124 and increases the thermal performance of semiconductor package 270. In addition, the vertically-oriented discrete electrical devices 164 and bumps 170 are arranged in multiple rows with some of the discrete electrical devices 164 and bumps 170 disposed between heat spreader 274 and conductive layer 150 of substrate 162. Bumps 276 are formed between conductive layer 237 of substrate 232 and terminals 168 of discrete electrical devices 164 and bumps 170.

Figure 13:
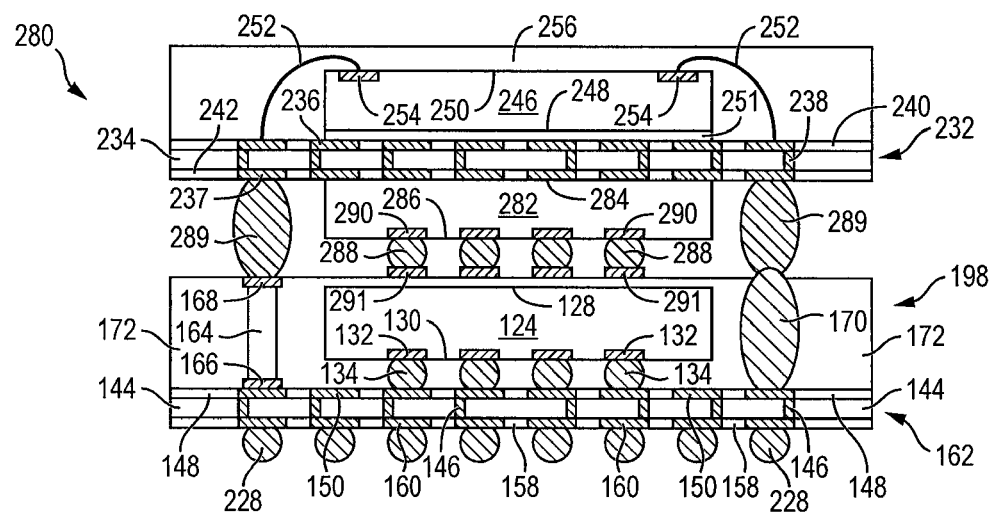
FIG. 13 illustrates the two stacked semiconductor packages with vertically-oriented discrete electrical devices as interconnect structures and intermediate semiconductor die.

FIG. 13 shows an embodiment of stackable semiconductor package 280, similar to FIG. 9, with semiconductor die 282 disposed between substrate 232 and semiconductor package 198. Semiconductor die 282 has a back surface 284 and active surface 286 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 286 to implement analog circuits or digital circuits, such as DSP, ASIC, memory, or other signal processing circuit. Semiconductor die 282 may also contain IPDs, such as inductors, capacitors, and resistors, for RF signal processing. Bumps 288 are formed over contact pads 290 of semiconductor die 282. Semiconductor die 282 is mounted active surface 286 to encapsulant 172 of semiconductor package 198. Bumps 288 are reflowed to electrically connect contact pads 290 to conductive layer 291 formed over encapsulant 172. Bumps 289 are formed between conductive layer 237 of substrate 232 and terminals 168 of discrete electrical devices 164 and bumps 170.

Figure 14:
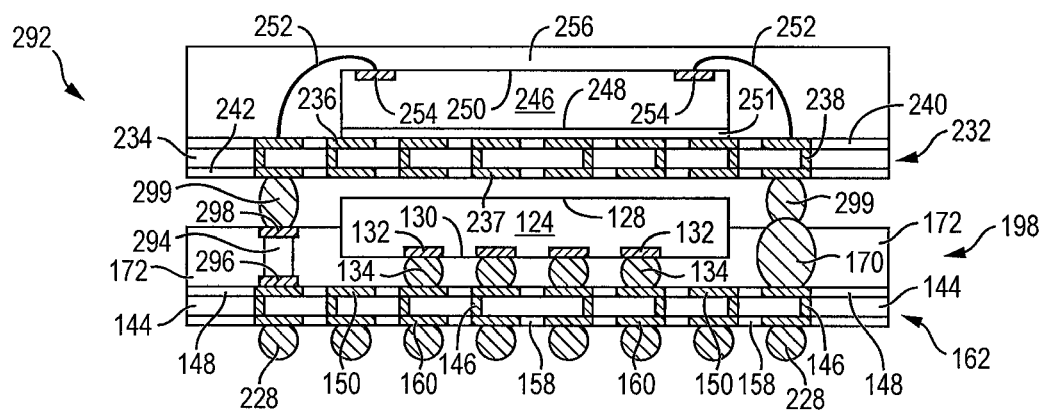
FIG. 14 illustrates the two stacked semiconductor packages with vertically-oriented discrete electrical devices as interconnect structures and stepped encapsulation.

FIG. 14 shows an embodiment of stackable semiconductor package 292, similar to FIG. 9, with a vertically-oriented discrete electrical device 294 having terminals 296 and 298. Terminal 296 is electrically connected to conductive layer 150 of substrate 162. The vertically-oriented discrete electrical device 294 can be a capacitor, resistor, inductor, diode, or transistor having a height less than the thickness of semiconductor die 124. In this case, encapsulant 172 or MUF material 176 is stepped below back surface 128 of semiconductor die 124 in order to expose terminal 298 for electrical connection to substrate 232 with bumps 299. That is, a portion of encapsulant 172 is removed so that the top surface of the encapsulant is at a level below back surface 128 of semiconductor die 124 in order to expose terminals 298.

Figure 15:
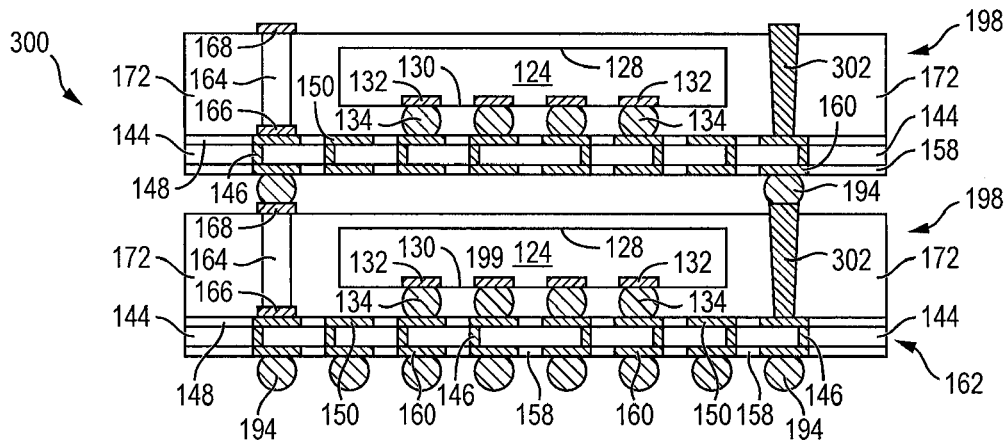
FIG. 15 illustrates the two stacked semiconductor packages with vertically-oriented discrete electrical devices and conductive vias as interconnect structures.

FIG. 15 shows an embodiment of stackable semiconductor package 300, similar to FIG. 7, with conductive vias 302 disposed through encapsulant 172 or MUF material 176. A plurality of vias is formed through encapsulant 172 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 302. Conductive vias 302 are electrically connected to conductive layer 150 of substrate 162 in the lower semiconductor package 198, and through bumps 194 to conductive layer 160 of substrate 162 in the upper semiconductor package 198. Semiconductor die 124 in the lower semiconductor package 198 is electrically connected to semiconductor die 124 in the upper semiconductor package 198 through bumps 134, conductive vias 302, substrates 162, and discrete electrical devices 164.

Figure 16:
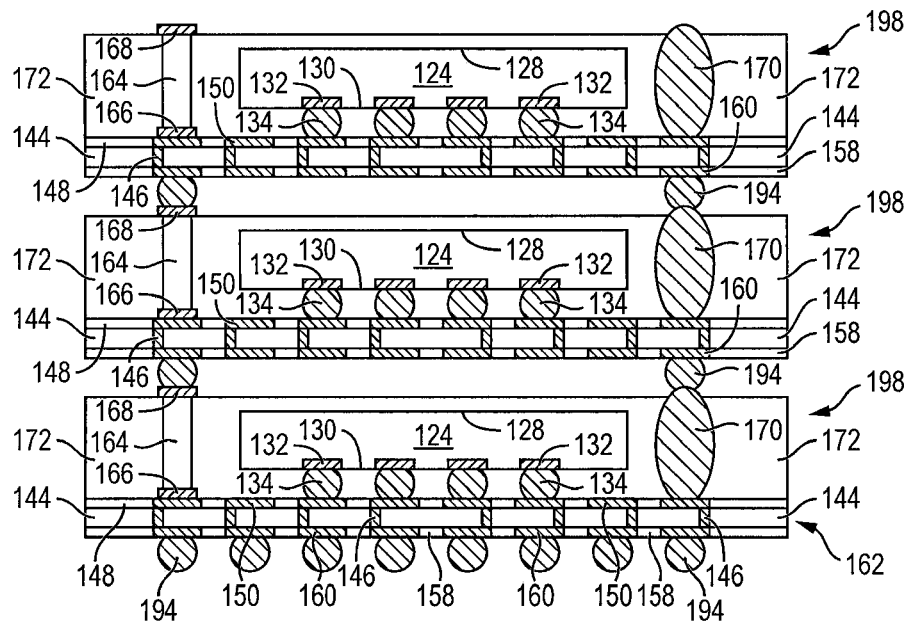
FIG. 16 illustrates the three stacked semiconductor packages with vertically-oriented discrete electrical devices and bumps as interconnect structures.

FIG. 16 shows three stacked semiconductor packages 198. Semiconductor die 124 in the lower semiconductor package 198 is electrically connected to semiconductor die 124 in the middle semiconductor package 198 and to semiconductor die 124 in the upper semiconductor package 198 through bumps 134 and 170, substrates 162, and discrete electrical devices 164.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first substrate;
    disposing a first semiconductor die over the first substrate;
    disposing a plurality of vertically-oriented discrete electrical devices over the first substrate with a first terminal of the vertically-oriented discrete electrical devices connected to the first substrate;
    forming a plurality of bumps over the first substrate around a perimeter of the first semiconductor die and adjacent to the vertically-oriented discrete electrical devices;
    depositing an encapsulant between the first semiconductor die and first substrate and around the first semiconductor die with a portion of the bumps and a second terminal of the vertically-oriented discrete electrical devices opposite the first terminal extending from the encapsulant; and
    forming an interconnect structure over a surface of the first substrate opposite the first semiconductor die.

2. The method of claim 1, wherein the vertically-oriented discrete electrical devices include a capacitor, inductor, resistor, diode, or transistor.

3. The method of claim 1, further including:
    stacking a plurality of semiconductor devices; and
    electrically connecting the stacked semiconductor devices through the first substrate, vertically-oriented discrete electrical devices, and bumps.

4. The method of claim 3, further including disposing a heat spreader between the stacked semiconductor devices.

5. The method of claim 3, further including disposing a second semiconductor die between the stacked semiconductor devices.

6. A method of making a semiconductor device, comprising:
    providing a first substrate;
    mounting a first semiconductor die to the first substrate;
    mounting a plurality of vertically-oriented discrete electrical devices over the first substrate with a first terminal of the vertically-oriented discrete electrical devices connected to the first substrate;
    forming a plurality of bumps over the first substrate adjacent to the vertically-oriented discrete electrical devices;
    depositing an encapsulant over and between the first semiconductor die and first substrate with a portion of the bumps and a second terminal of the vertically-oriented discrete electrical devices opposite the first terminal extending from the encapsulant;
    providing a second substrate;
    mounting the second substrate to the second terminal of the vertically-oriented discrete electrical devices prior to depositing the encapsulant; and
    forming an interconnect structure over a surface of the first substrate opposite the first semiconductor die.

7. The method of claim 6, wherein the vertically-oriented discrete electrical devices include a capacitor, inductor, resistor, diode, or transistor.

8. The method of claim 6, further including:
stacking a plurality of semiconductor devices; and
electrically connecting the stacked semiconductor devices through the first substrate, vertically-oriented discrete electrical devices, and bumps.

9. The method of claim 6, wherein a height of the vertically-oriented discrete electrical devices is greater than a thickness of the semiconductor die.

10. A method of making a semiconductor device, comprising:
providing a first substrate;
disposing a semiconductor die over the first substrate;
disposing a discrete electrical device over the first substrate with a first terminal of the discrete electrical device connected to the first substrate and a second terminal of the discrete electrical device vertically aligned with the first terminal;
disposing a first interconnect structure over the discrete electrical device; and
disposing a second substrate over the first interconnect structure and electrically connected through the first interconnect structure and discrete electrical device to the first substrate.

11. The method of claim 10, further including forming a second interconnect structure over the first substrate adjacent to the discrete electrical device.

12. The method of claim 10, wherein a height of the discrete electrical device is less than a thickness of the semiconductor die.

13. The method of claim 10, further including disposing a conductive pillar or bump in line with the discrete electrical device to provide vertical standoff for the discrete electrical device.

14. The method of claim 10, wherein the discrete electrical device includes a capacitor, inductor, resistor, diode, or transistor.

15. The method of claim 10, further including:
depositing an encapsulant over and between the semiconductor die and first substrate with the second terminal of the discrete electrical device extending from the encapsulant; and
disposing the second substrate over the second terminal of the discrete electrical device prior to depositing the encapsulant.

16. The method of claim 10, further including:
stacking a plurality of semiconductor devices; and
electrically connecting the stacked semiconductor devices through the first substrate and discrete electrical device.

17. A method of making a semiconductor device, comprising:
providing a first substrate;
disposing a semiconductor die over the first substrate;
forming a first interconnect structure over the first substrate; and
disposing a discrete capacitive device over the first interconnect structure as a second interconnect structure, the discrete capacitive device including a first terminal and a second terminal vertically aligned with the first terminal of the discrete capacitive device to provide an electrical interconnect extending from the first substrate through the first interconnect structure and discrete capacitive device.

18. The method of claim 17, further including forming as third interconnect structure over the first substrate adjacent to the discrete capacitive device.

19. The method of claim 18, wherein the third interconnect structure includes bumps or conductive pillars.

20. The method of claim 17, further including forming a third interconnect structure over a surface of the first substrate opposite the semiconductor die.

21. The method of claim 17, further including:
providing a second substrate; and
disposing the second substrate over the discrete capacitive device.

22. The method of claim 17, further including:
stacking a plurality of semiconductor devices; and
electrically connecting the stacked semiconductor devices through the first substrate and discrete capacitive device.

23. A semiconductor device, comprising:
a substrate;
a semiconductor die disposed over the substrate;
an encapsulant formed over the substrate and around the semiconductor die including a top surface of the encapsulant below a surface of the semiconductor die; and
a discrete capacitive device disposed over the substrate with a first terminal of the discrete capacitive device connected to the substrate and a second terminal of the discrete capacitive device opposite the first terminal, and vertically aligned with the first terminal.

24. The semiconductor device of claim 23, further including an interconnect structure formed adjacent to the discrete capacitive device.

25. The semiconductor device of claim 23, wherein a height of the discrete capacitive device is less than a thickness of the semiconductor die.

26. The semiconductor device of claim 23, further including a plurality of stacked semiconductor devices electrically connected through the substrate and discrete capacitive device.

27. A semiconductor device, comprising:
a first substrate;
a semiconductor die disposed over a surface of the first substrate;
a capacitor disposed over the surface of the first substrate as a first interconnect structure coupled to the first substrate, the capacitor including a first terminal and a second terminal vertically aligned with the first terminal of the capacitor; and
an interconnect structure disposed over the surface of the first substrate, including a height of the interconnect structure greater than a height of the capacitor.

28. The semiconductor device of claim 27, wherein the capacitor provides z-direction vertical interconnect for the first substrate.

29. The semiconductor device of claim 27, further including a second substrate disposed over the capacitor opposite the first substrate.

30. The semiconductor device of claim 27, wherein the interconnect structure further includes a bump.

31. The semiconductor device of claim 27, further including a plurality of stacked semiconductor devices electrically connected through the capacitor.

32. A semiconductor device, comprising:
a first substrate;
a semiconductor die disposed over the first substrate;
a bump formed between the first substrate and semiconductor die; and
a discrete capacitive device disposed over the first substrate with the discrete capacitive device configured for electrically connecting the first substrate to an additional semiconductor device.

33. The semiconductor device of claim 32, further including a semiconductor package stacked over the discrete capacitive device with the first substrate electrically coupled to the semiconductor package through the discrete capacitive device.

34. The semiconductor device of claim 32, further including an encapsulant disposed over the semiconductor die, first substrate, and discrete capacitive device with a portion of the discrete capacitive device extending from the encapsulant opposite the first substrate.

35. The semiconductor device of claim 32, further including a bump disposed over the first substrate within a perimeter of the semiconductor die.

36. The semiconductor device of claim 32, further including a second substrate disposed over the discrete capacitive device opposite the first substrate.

* * * * *

UNITED STATES PATENT AND TRADEMARK OFFICE
CERTIFICATE OF CORRECTION

PATENT NO. : 9,190,297 B2  
APPLICATION NO. : 13/208027  
DATED : November 17, 2015  
INVENTOR(S) : DaeSik Choi et al.

It is certified that error appears in the above-identified patent and that said Letters Patent is hereby corrected as shown below:

In the Claims

Column 15, line 63 please replace "as" with -- a --.

Signed and Sealed this  
Twenty-first Day of June, 2016

Michelle K. Lee  
*Director of the United States Patent and Trademark Office*